(12) United States Patent
Yoshitaka

(10) Patent No.: US 6,764,939 B1
(45) Date of Patent: Jul. 20, 2004

(54) SEMICONDUCTOR DEVICE AND METHOD OF MANUFACTURING THE SAME

(75) Inventor: Hikaru Yoshitaka, Fuchu (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/658,861

(22) Filed: Sep. 8, 2000

Related U.S. Application Data (63) Continuation of application No. PCT/JP00/01321, filed on Mar. 6, 2000.

(30) Foreign Application Priority Data

Mar. 9, 1999 (JP) .............................. 11-062381

(51) Int. Cl.$^7$ .................... H01L 21/4763; H01L 21/461
(52) U.S. Cl. ...................... 438/624; 438/634; 438/638; 438/706; 438/738
(58) Field of Search ................. 438/622–624, 438/634, 637–640, 700, 703, 706, 709–711, 717, 725, 735, 737, 738, 740, 702

(56) References Cited

U.S. PATENT DOCUMENTS

| | | | |
|---|---|---|---|
| 5,882,826 A | * 3/1999 | Kato et al. | 430/5 |
| 6,077,769 A | * 6/2000 | Huang et al. | 438/622 |
| 6,100,184 A | * 8/2000 | Zhao et al. | 438/638 |
| 6,211,061 B1 | * 4/2001 | Chen et al. | 438/622 |
| 6,211,068 B1 | * 4/2001 | Huang | 438/634 |

FOREIGN PATENT DOCUMENTS

| | | |
|---|---|---|
| JP | 9-275138 | 10/1997 |
| JP | 10-144676 | 5/1998 |
| JP | 10-144677 | 5/1998 |
| JP | 2000-77406 | 3/2000 |

\* cited by examiner

*Primary Examiner*—Ha Tran Nguyen
(74) *Attorney, Agent, or Firm*—Finnegan, Henderson, Farabow, Garrett, & Dunner, L.L.P.

(57) ABSTRACT

A hard mask 105 of SiCN is formed on a fluorine-containing carbon film 103. Thus, the adhesion of the hard mask 105 to the fluorine-containing carbon 103 is improved and inhibited from being peeled off. The hard mask 105 of SiCN can hare a higher etch-selectivity than those of conventional hard masks, and can have a lower dielectric constant than that of SiN or SiC.

17 Claims, 11 Drawing Sheets

SEMICONDUCTOR DEVICE AND METHOD OF MANUFACTURING THE SAME

This application is a continuation of PCT/JP00/01321 filed Mar. 6, 2000.

TECHNICAL FIELD

The present invention relates to a semiconductor device, which uses a carbon-containing layer, such as a fluorine-containing carbon film, as an insulating film, and a method of manufacturing the same.

BACKGROUND ART

In order to achieve the high-density integration of semiconductor integrated circuits, it has been developed to scale down patterns, such as wiring, and to multilayer circuits. As one of such developments, there is a multi-layer metallization technique for constructing multi-layer wiring. In this multi-layer metallization technique, upper and lower wiring layers are connected to each other by a conductive part which is arranged in a predetermined region, and an interlayer dielectric film of an insulating material is arranged to separate the wiring layers from each other in a region other than the conductive part.

Typical materials of the interlayer dielectric films include silicon oxide ($SiO_2$). In recent years, in order to more accelerate the operation of integrated circuits, it has been required to lower the relative dielectric constant of the interlayer dielectric films. That is, the relative dielectric constant $\epsilon$ of $SiO_2$ is about 4, and materials having a lower relative dielectric constant than that of $SiO_2$ have been diligently developed.

As an example of a material having a lower relative dielectric constant than that of $SiO_2$, there is a fluorine-containing carbon film comprising carbon and fluorine. This fluorine-containing carbon film can be formed by, e.g., a plasma deposition process using the electron cyclotron resonance (ECR). This method will be described below.

Figure 10:
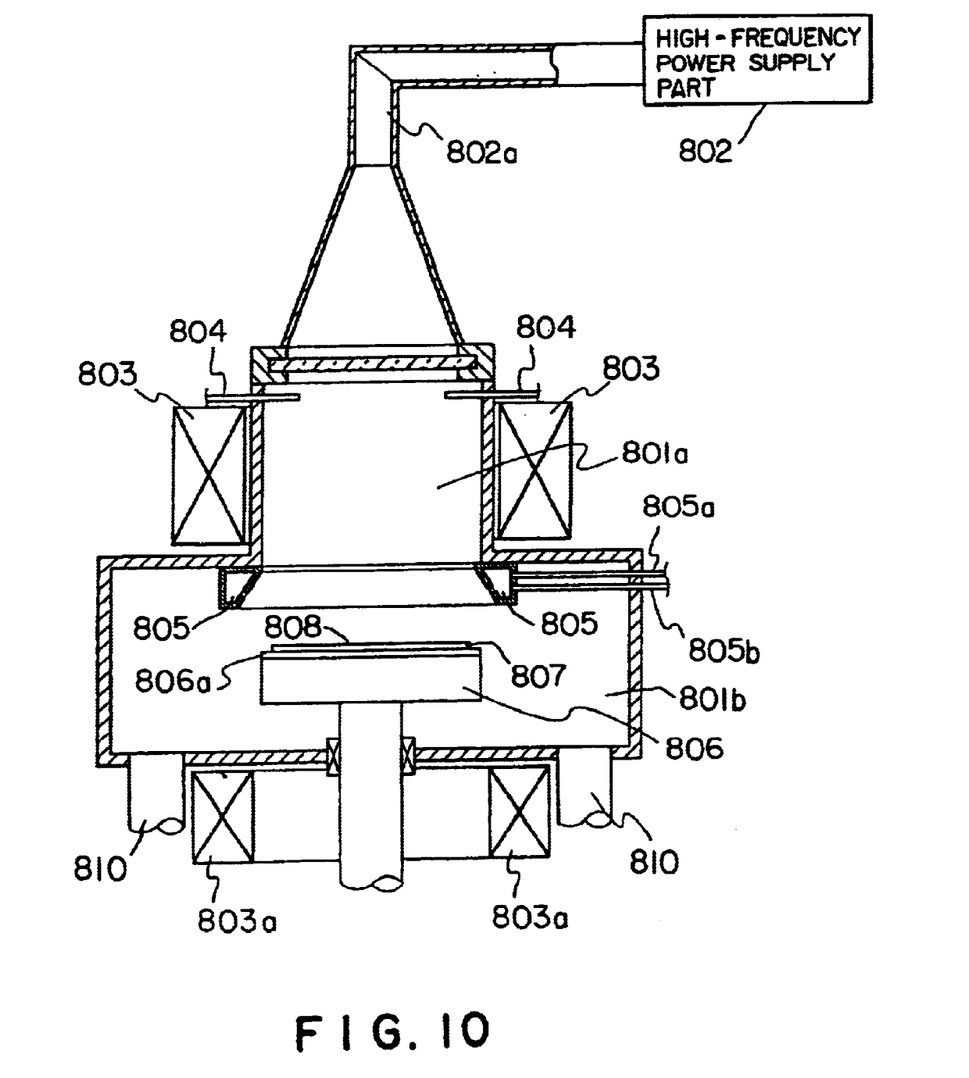
FIG. 10 is a schematic longitudinal section showing the structure of a plasma deposition system for forming a fluorine-containing carbon film.

In a deposition system shown in FIG. 10, a microwave of 2.45 GHz is first supplied into a plasma producing chamber 801a from a high-frequency power supply part 802 via a waveguide 802a. At this time, a magnetic field of 875 gausses is applied by magnetic coils 803 and 803a, and Ar gas introduced from an introducing pipe 804 is activated as a high-density plasma by the electron cyclotron resonance.

On the other hand, $C_4F_8$ gas and $C_2H_4$ gas are introduced into a deposition chamber 801b from a gas supply part 805 via gas introducing pipes 805a and 805b to be activated by the high-density plasma to form active-species. By the active-species, a fluorine-containing carbon film 808 having good adhesion and high hardness is formed on the surface of a wafer 807 which is arranged on a supporting table 806 in the deposition chamber 801b. The wafer 807 is fixed by an electrostatic chuck 806a on the supporting table 806. The interior of the deposition chamber 801b is evacuated to a predetermined degree of vacuum by an evacuating means (not shown) which is communicated with the deposition chamber 801b via an exhaust pipe 810.

By the foregoing, the fluorine-containing carbon film can be formed. However, in order to use the fluorine-containing carbon film as an interlayer dielectric film, it is required to carry out a fine patterning process, such as the formation of a hole portion for arranging a connecting portion for connecting upper and lower wiring layers to each other.

Figure 11:
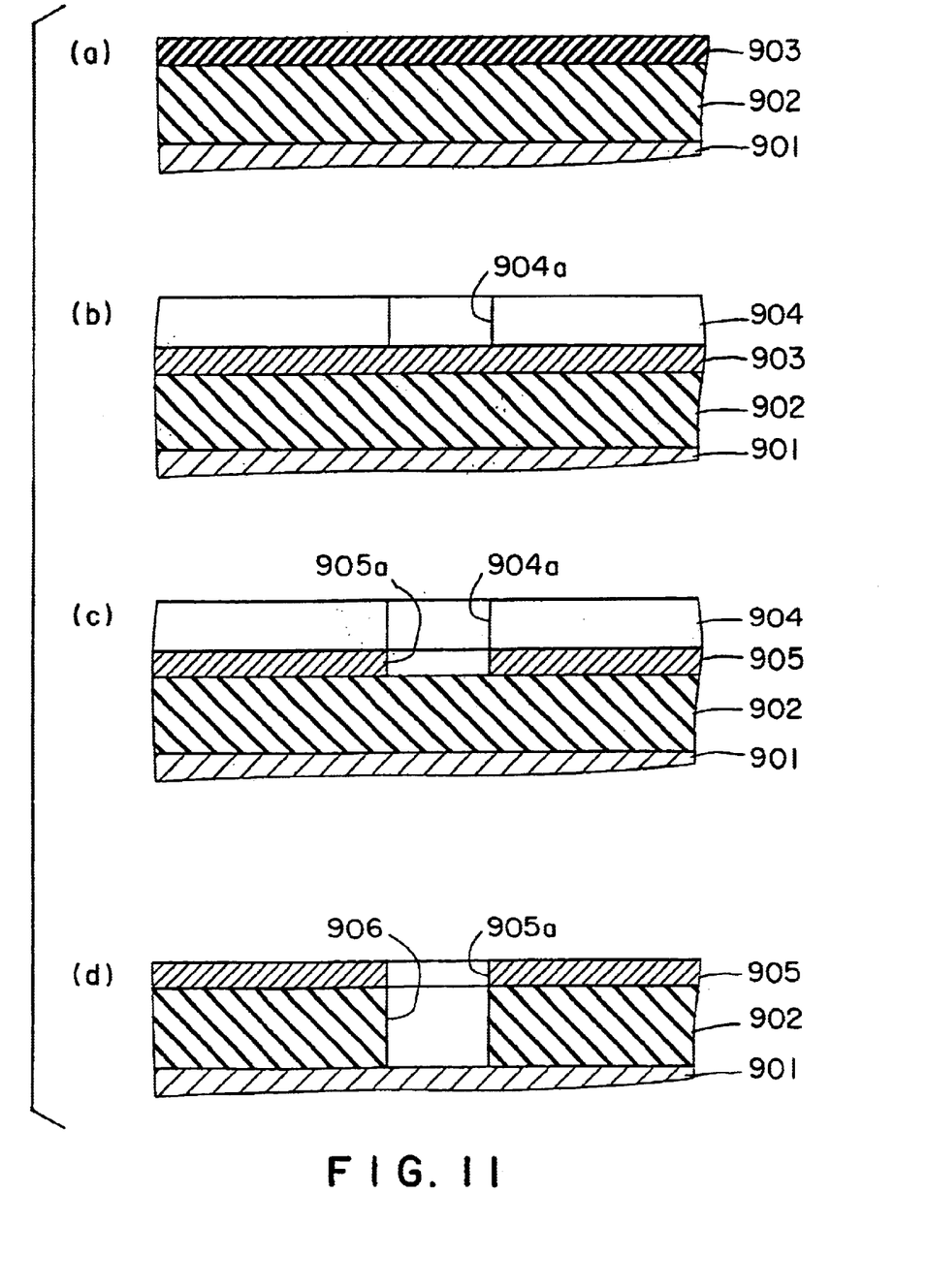
FIG. 11 is a schematic longitudinal section showing steps (a) through (d) of a conventional method of manufacturing a semiconductor device.

The fine patterning process of the fluorine-containing carbon film will be described below. First, as shown in FIG. 11(a), a fluorine-containing carbon film 902 is formed on a lower wiring layer 901 serving as a substrate as described above. On the fluorine-containing carbon film 902, an inorganic film 903 of $SiO_2$ is formed. Then, as shown in FIG. 11(b), a resist pattern 904 having an opening 904a at a predetermined place is formed on the inorganic film 903 by a well-known photolithography technique.

The resist pattern 904 is then used as a mask to selectively etch the inorganic film 903. Thus, as shown in FIG. 11(c), a hard mask 905 having an opening 905a at a position corresponding to the opening 904a is formed. This etching may be, e.g., a dry etching with the plasma of $CF_4$.

The hard mask 905 is then used as a mask to selectively etch the fluorine-containing carbon film 902. Thus, as shown in FIG. 11(d), a hole portion 906 is formed in the fluorine-containing carbon film 902. This etching may be, e.g., a dry etching with the plasma of oxygen gas. If oxygen gas is used, the etch-selectivity (the ratio of etch rates) between the fluorine-containing carbon film 902 and the hard mask 905 can be great. If the plasma of oxygen gas is used, the resist pattern 904 can be simultaneously removed.

The fine patterning process of the fluorine-containing carbon film using the hard mask will be described below.

In the fine patterning process, a resist pattern formed by the photolithography technique is generally used as a mask to selectively etch. At this time, the resist pattern must have an etching resistance as a mask for an underlying layer to be processed. When the layer to be processed is thick, the resist pattern must particularly have the etching resistance. This resist pattern is formed by, e.g., exposing and developing a photoresist having photosensitivity, and made of an organic material.

However, when an organic film, such as the above described fluorine-containing carbon film, is fine-patterned, the dry etching with the plasma of oxygen is used. In this case, if a resist pattern of an organic film is used as a mask, the resist pattern is also etched, so that it is not possible to carry out a selective etching.

On the other hand, if a master pattern of an inorganic material, such as $SiO_2$, is used when the fluorine-containing carbon film is etched with the plasma of oxygen gas, the master pattern is hardly etched with the plasma of oxygen, so that it is possible to carry out a selective etching For that reason, as described above, a hard mask of $SiO_2$ or the like is used for fine-patterning the fluorine-containing carbon film.

By the way, in order to form this hard mask, an inorganic film of $SiO_2$ or the like is patterned. This patterning may use a dry etching with the plasma of $CF_4$ or $C_4F_8$. In this case, since the resist pattern of the organic film is hardly etched, the resist pattern can be used as a mask to carry out the selective etching to form the hard mask as described above.

However, if a hard mask of $SiO_2$ or silicon nitride (SiN), which are generally used for patterning organic films, is used for fine-patterning the fluorine-containing carbon film, there are the following problems, so that the reliability of semiconductor devices using a fluorine-containing carbon film as an interlayer film is deteriorated.

First, since $SiO_2$ and SiN have low adhesion to the fluorine-containing carbon film which is a fluorine-containing organic film, there is a problem in that the hard mask is easily peeled off. As described above, since the hard mask is made of the insulating material, the hold mask is used as a part of an interlayer dielectric film. However, after the fluorine-containing carbon film serving as the interlayer dielectric film is fine-patterned, if a stress in applied in the subsequent process such as forming a metal film for a wiring electrode thereon, the hard mask is sometimes peeled off. If the metal film for the wiring electrode is intended to be flattened by the chemical mechanical polishing method after the metal film is formed, a great stress is applied thereto, so that the hard mask is substantially surely peeled off from the fluorine-containing carbon film.

Next, if the hard mask of $SiO_2$ or SiN is used for fine-patterning the fluorine-containing carbon film, there is a problem in that the etch-selectivity is lowered as follows. As described above, the dry etching with the plasma of oxygen gas is used for fine-patterning the fluorine-containing carbon film. In view of only this point, a high etch-selectivity should be obtained it the hard mask is made of $SiO_2$ or SiN.

However, when the fluorine-containing carbon film is etched with the plasma of oxygen gas, the fluorine-containing carbon film is decomposed to produce F (fluorine) and C (carbon) in atmosphere, and the active-species of F and C are produced by plasma. As a result, since $SiO_2$ or SiN is etched with the active-species, there is a problem in that if the conventional hard mask, together with the fluorine-containing carbon film, is etched, the etch-selectivity is lowered to deteriorate processing precision.

From the point of view of the acceleration of semiconductor devices, it is desired that the insulating film used as the hard mask is made of a material having a lower relative dielectric constant similar to the insulating film of the fluorine-containing carbon film.

DISCLOSURE OF THE INVENTION

The present invention has been made in order to eliminate the above described problems. That is, it is an object of the present invention to improve the reliability of a semiconductor device, which has a carbon-containing insulating film, such as a fluorine-containing carbon film, while considering the acceleration of the same.

In order to accomplish this object, according to one aspect of the present invention, a semiconductor device is provided, the device comprising: a semiconductor substrate, on which an active region is formed; a plurality of wiring layers which are formed on the semiconductor substrate; a first insulating layer containing carbon, the first insulating layer being formed at least between any adjacent two of the wiring layers; and a second insulating layer comprising silicon, carbon and nitrogen, the second insulating layer being formed on the first insulating layer.

With this construction, the first insulating layer containing carbon contacts the second insulating layer comprising silicon, carbon and nitrogen, so that the adhesion between the first and second insulating layers is improved to inhibit peeling. The second insulating layer comprising silicon, carbon and nitrogen can have a higher etch-selectivity than those of conventional layers, and can have a lower dielectric constant than that of an insulating layer comprising silicon and nitrogen or an insulating layer comprising silicon and carbon. Therefore, it is possible to improve the reliability of the semiconductor device while considering the acceleration of the same.

In such a semiconductor device, the second insulating layer preferably further comprises boron in order to lower the relative dielectric constant of the second insulating layer.

An adhesion layer comprising a high-melting point metal and a nitride thereof may be provided in the interface between the first insulating layer and the wiring layers.

According to another aspect of the present invention, a method of manufacturing a semiconductor device is provided, the method comprising the steps of: forming a wiring layer on a semiconductor substrate, on which an active region is formed; forming a first insulating layer containing carbon on the wiring layer; forming a second insulating layer comprising silicon, carbon and nitrogen on the first insulating layer; selectively etching the second insulating layer until the surface of the first insulating layer is partially exposed, selectively etching the first insulating layer using the selectively-etched, second insulating layer, as a mask; and forming a new wiring layer on the second insulating layer after selectively etching the first insulating layer.

With this construction, it is possible to obtain a semiconductor device wherein the first insulating layer containing carbon contacts the second insulating layer comprising silicon, carbon and nitrogen, between the wiring layers. Thus, the adhesion between the first and second insulating layers is improved to inhibit peeling. The second insulating layer comprising silicon, carbon and nitrogen, can have a higher etch-selectivity than those of conventional layers, and can have a lower dielectric constant than that of an insulating layer comprising silicon and nitrogen or an insulating layer comprising silicon and carbon. Therefore, it is possible to improve the reliability of the semiconductor device while considering the acceleration of the same.

This producing method preferably further comprises a step of adding boron to the second insulating layer in order to lower the relative dielectric constant of the second insulating layer.

The step of selectively etching the second insulating layer may be carried out with the plasma of the gas of a compound containing carbon and fluorine or with the plasma of the gas of a compound containing carbon and hydrogen.

If the step of selectively etching the first insulating layer is carried out with the plasma of an oxygen-containing gas, the second insulating layer and the wiring layers are hardly etched.

If the step of selectively etching the first insulating layer is carried out with the plasma of a hydrogen-containing gas, the step is controlled by the etching with reactive ions, so that it is possible to carry out a higher anisotropic etching.

BRIEF DESCRIPTION OF THE DRAWINGS

FIG. 1b is an enlarged view showing a part of the structure shown in FIG. 1a;

BEST MODE FOR CARRYING OUT THE INVENTION

Referring to drawings, the preferred embodiments of the present invention will be described below.

[First Preferred Embodiment]

Figure 1A:
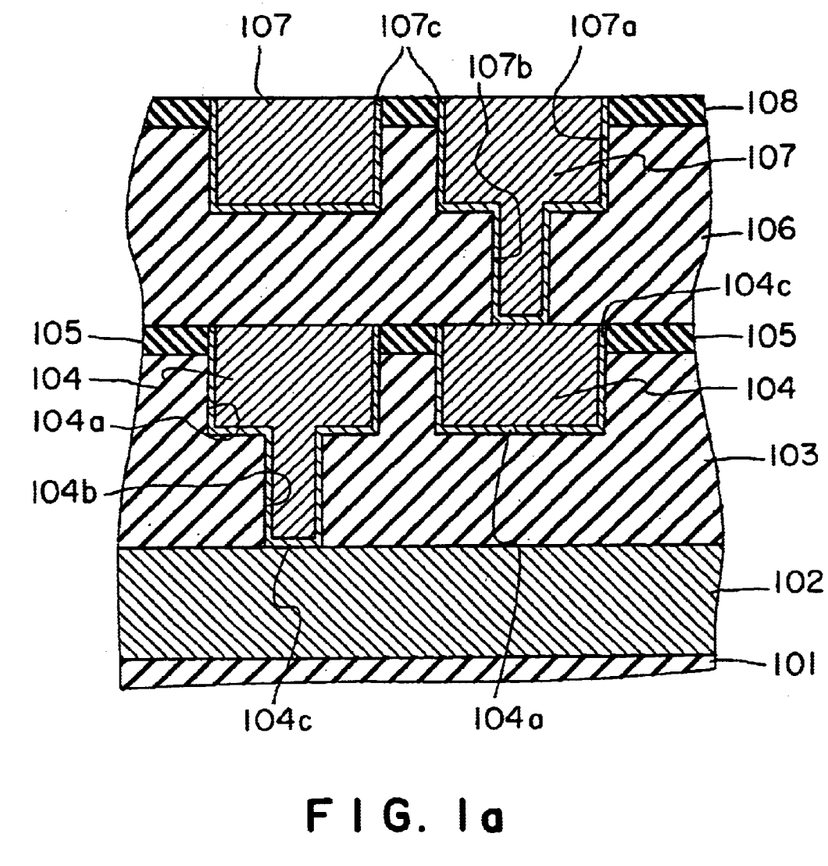
FIG. 1a is a local longitudinal section showing the structure of a preferred embodiment of a semiconductor device according to the present invention.

First, a semiconductor device serving as the first preferred embodiment of the present invention will be described. In this preferred embodiment, a semiconductor device is constructed as shown in FIG. 3a. This construction will be described. An insulating film 101, e.g., an $SiO_2$ film, is formed so as to cover an active region (not shown), such as a MOS transistor, which is formed on a semiconductor substrate of silicon (Si). A wiring layer (not shown) of, e.g., W, which is electrically connected to the active region, and a wiring layer 102 of, e.g., copper (Cu), connected to the wiring layer are formed on the insulating film 101.

On the $SiO_2$ film 101, a fluorine-containing carbon film 103 serving as a first insulating film is formed so as to cover the Cu layer 102. In the fluorine-containing carbon film 103, a groove portion 104a and a hole portion 104b are formed. In the groove portion 104a and the hole portion 104b, a wiring layer 104 of, e.g., Cu, is formed. The wiring layer 104 is electrically connected to the Cu layer 102. Between the contact surfaces of the Cu layer 104 and the fluorine-containing carbon film 103, and between the contact surface of the Cu layer 104 and the Cu layer 102, an adhesion layer 104c is formed.

Figure 1B:
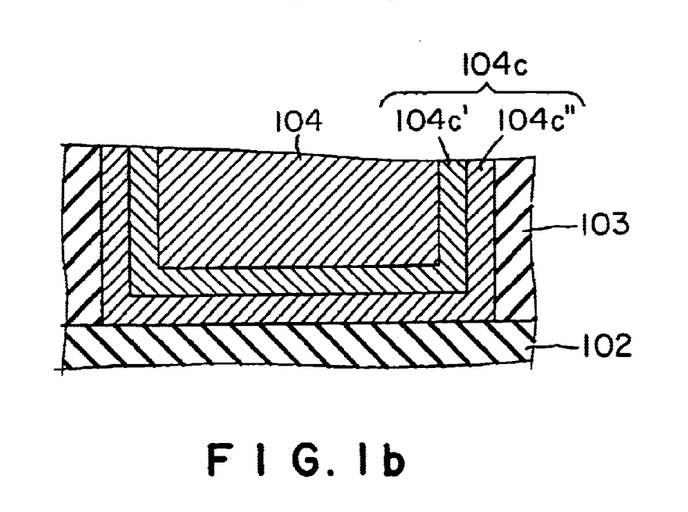

In order to improve the adhesion of the Cu layer 104 to the fluorine-containing carbon film 103, the adhesion layer 104c comprises, e.g., a Tin layer 104c', and a Ti layer 104c" as shown in FIG. 1b. The structure of the adhesion layer 104c should not be limited to such a TiN/Ti stacked structure, but it may be another stacked structure of a high-melting point metal nitride and a high-melting point metal, such as TaN/Ta or WN/W.

In the first preferred embodiment, a hard mask 105 of SiCN serving as a second insulating film having a thickness of about 100 nm is formed on the fluorine-containing carbon film 103. The SiCN does not always mean a chemical composition or a chemical bonding structure, but it means to include Si, C and N as components.

On the hard mask 105, a fluorine-containing carbon film 106 serving as a first insulating layer, a Cu layer 107 embedded in a groove portion 107a and a hole portion 107b, an adhesion layer 107c, and a hard mask 108 of SiCN are formed so as to have the same structure as that described above. That is, the hard mask 108 of SiCN is also formed on the fluorine-containing carbon film 106 so as to have a thickness of about 100 nm. Since the Cu layer 104 and the Cu layer 107 are made of the same material, it is not required to form any barrier films on the contact interface therebetween.

As described above, in this first preferred embodiment, the hard masks 105 and 108 are provided on the interlayer dielectric films 103 and 106 of the fluorine-containing carbon films. As a result, for example, the hard mask 105 of SiCN is arranged between the fluorine-containing carbon film 103 and the fluorine-containing carbon film 106, so that the adhesion between the respective layers 103, 105 and 106 can be more improved than conventional devices using a hard mask of $SiO_2$.

On the hard mask 108 and the Cu layer 107, the same stacked structure may be provided to form a semiconductor device. That is, an optional number of stages of the same stacked structures may be stacked to form a semiconductor device.

A method of manufacturing the above described wiring structure will be described below. Steps after the formation of the Cu layer 104 and the hard mask 105 will be described.

Figure 2:
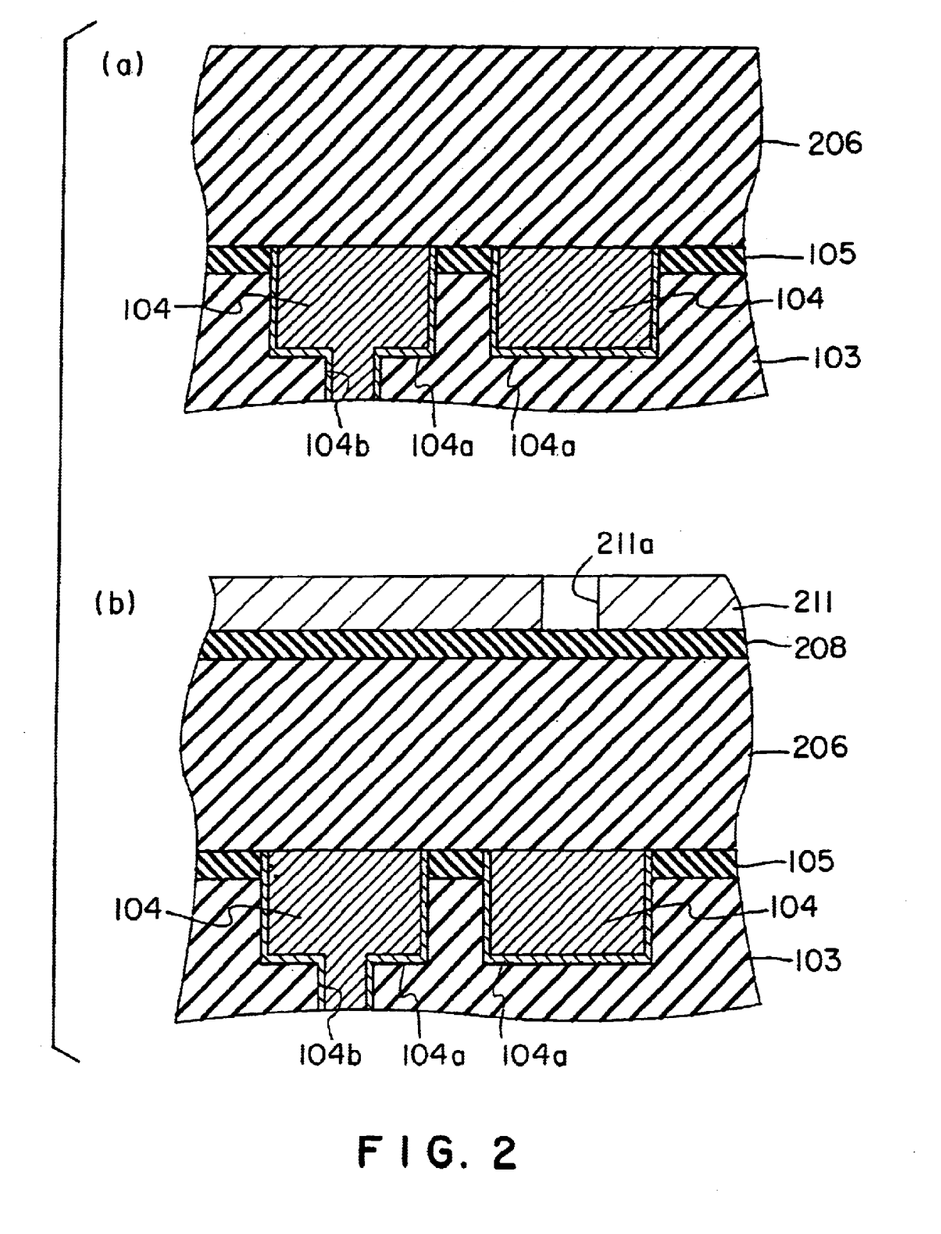
FIG. 2 is a schematic longitudinal section showing steps (a) through (h) of a preferred embodiment of a method of manufacturing a semiconductor device according to the present invention.

First, as shown in FIG. 2(a), a fluorine-containing carbon film 206 having a thickness of about 700 nm is formed on the Cu layer 104 and the hard mask 105 of SiCN. As described above, the fluorine-containing carbon film 206 is formed by a plasma deposition process using the electron cyclotron resonance (ECR) using $C_4F_6$ gas and $C_2H_4$ gas as raw material gases.

Then, as shown in FIG. 2(b), an insulating film 208 of SiCN is formed on the fluorine-containing carbon film 206. This may be formed by the chemical vapor deposition (CVD) method using, e.g., $SiH_4$, $C_2H_4$ and $N_2$ as raw material gases. On the insulating film 208, a resist pattern 211 having a hole portion 211a at a predetermined place is formed. The resist pattern 211 may be formed by a well-known photolithography technique.

The resist pattern 211 is then used as a mask to etch the insulating film 208 to form a hard mask 108 having a hole portion 208a as shown in FIG. 2(c). The etching may use, e.g., a dry etching with the plasma of $C_4F_5$.

The hard mask 108 having the hole portion 208a is then used as a mask to etch the underlying fluorine-containing carbon film 206. This etching may be a reactive ion etching with the plasma of oxygen gas. Since the hard mask 108 is made of SiCN as described above, the hard mask 108 is hardly etched with the plasma of oxygen gas. On the other hand, the fluorine-containing carbon film 206 is etched (ashed) with the plasma of oxygen gas. By this etching process, a hole portion 206a can be formed in the fluorine-containing carbon film 206 as shown in FIG. 2(d). Since the plasma of oxygen gas is used at this time, the resist pattern 211 of the organic film is simultaneously removed.

The etch-selectivity of the fluorine-containing carbon film and the hard mask of SiCN in the dry etching using the plasma of oxygen gas will be described. When hard mask materials, Such as $SiO_2$ and SiN, together with the fluorine-containing carbon film, are dry-etched with the plasma of oxygen gas, etch rates (nm/min.) are shown as follows.

| Fluorine-containing carbon film | 1538 |
| --- | --- |
| SiN | 37 |
| SiC | 45 |
| $SiO_2$ | 42 |
| SiCN | 15 |

As shown above, when each of the hard materials is processed simultaneously with the fluorine-containing carbon film, the etch rate of SiCN with the plasma of oxygen gas is a far smaller than those of other hard mask materials. Therefore, if the hard mask of SiCN is used as this first preferred embodiment, it is possible to obtain a high etch-selectivity in the etching for the fluorine-containing carbon film, so that it is possible to more improve processing precision.

Then, as shown in FIG. 2(e), a resist pattern 212 having a groove portion 212a is formed on the hard mask 108. The resist pattern 212 may be formed by a well-known photolithography technique. The groove portion 212a is formed so as to overlap with the hole portion 206a.

The resist pattern 212 is then used as a mask to etch the hard mask 208 to form a groove 108a in the hard mask 108. This etching may be, e.g., a dry etching with the plasma of $C_4F_5$. Since the fluorine-containing carbon film 206 is hardly etched by the dry etching with the plasma $C_1F_5$, the hard mask 108 can be selectively etched.

The hard mask 108 having the groove portion 108a is then used as a mask to etch the fluorine-containing carbon film 206 to form a fluorine-containing carbon film 106 formed with a groove portion 107a having a depth of about 400 m as shown in FIG. 2(f). At this step, a reactive ion etching with the plasma of oxygen gas may be used. Since the plasma of oxygen gas is used, the resist pattern 212 on the hard mask 108 simultaneously removed. Then, a through-hole 107b based on the hole portion 206a, which has been formed in the fluorine-containing carbon film 206, is arranged in a region in which he groove portion 107a of the fluorine-containing carbon film 106 intends to be formed.

Then, as shown in FIG. 2(g), a thin metal film 207a, which is an adhesion layer of a TiN layer and a Ti layer, is formed so as to cover the hard mask 108 and the surfaces of the through-hole 107b and groove portions 107a and 108a. A metal film 207 of copper is then formed on the hard mask 108 via the metal film 207a so as to be filled in the through-hole 107b and the groove portions 107a and 108a. The metal film 207 may be formed by, e.g., a well-known metal film forming method, such as an electroless plating or a sputtering method.

The metal films 207 and 207a are then polished from the surface by the chemical mechanical polishing (CMP). If the surface of the hard mask 108 is thus exposed as shown in FIG. 2(h), the Cu layer 107 is arranged on the Cu layer 104 via the fluorine-containing carbon film 106, and the fluorine-containing carbon film 106 and the Cu layer 107 contact each other via the adhesion layer 107c having the TiN/Ti structure. Of course, the steps of forming the fluorine-containing carbon film 103 through the Cu layer 104 can be carried out substantially in the same manner although the descriptions of these steps are omitted.

The adhesions of the above described hard mask material of SiCN and a conventional hard mask material of $SiO_2$ to a fluorine-containing carbon film stacked thereto were compared with each other. In this case, the adhesive strengths in a triple layer structure of "fluorine-containing carbon film/hard mask/fluorine-containing carbon film" were compared with each other. As a reference, a hard mask material of SiN was examined.

Figure 3:
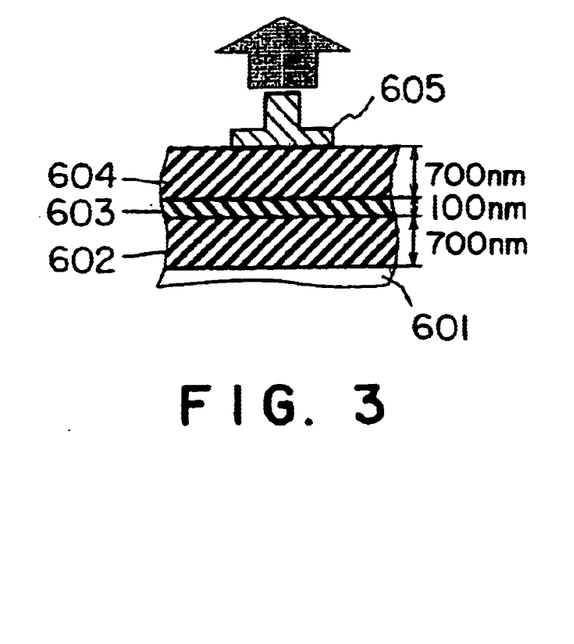
FIG. 3 is a schematic longitudinal section for explaining a method for measuring adhesive strength.

The adhesive strengths are measured as follows. First, as shown in FIG. 3, a fluorine-containing carbon film 602, a hard mask 603 and a fluorine-containing carbon film 604 are sequentially stacked on a substrate 601 to prepare a sample, and a test rod 605 is fixed to the fluorine-containing carbon film 604 by a predetermined adhesive. A load is then applied to the test rod 605 so that the test rod 605 goes away from the substrate while the substrate 601 is fixed. It is assumed that the adhesive strength is a load (Kpsi) applied when any one of the films is peeled off.

Figure 4:
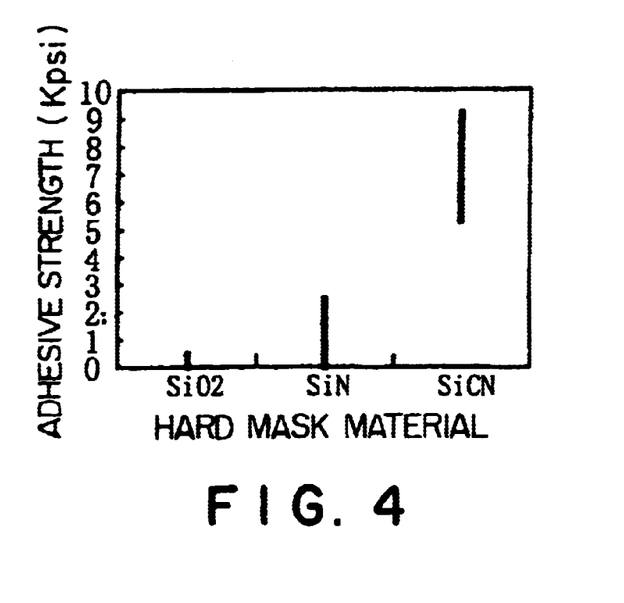
FIG. 4 is a graph showing the difference between the adhesive strengths of hard mask materials.

The measured results of the above described adhesive strengths are shown in FIG. 4. As can be seen from FIG. 4, the adhesive strength to the fluorine-containing carbon film is remarkably improved by using SiCN as the material of the hard mask. When an adhesive strength of 5 Kpsi or more is thus obtained between the hard mask and the fluorine-containing carbon film, even if the hard mask remains as a part of the interlayer film, the hard mask is inhibited from being peeled off by the chemical mechanical polishing during the formation of the electrode (wiring layer).

Figure 5:
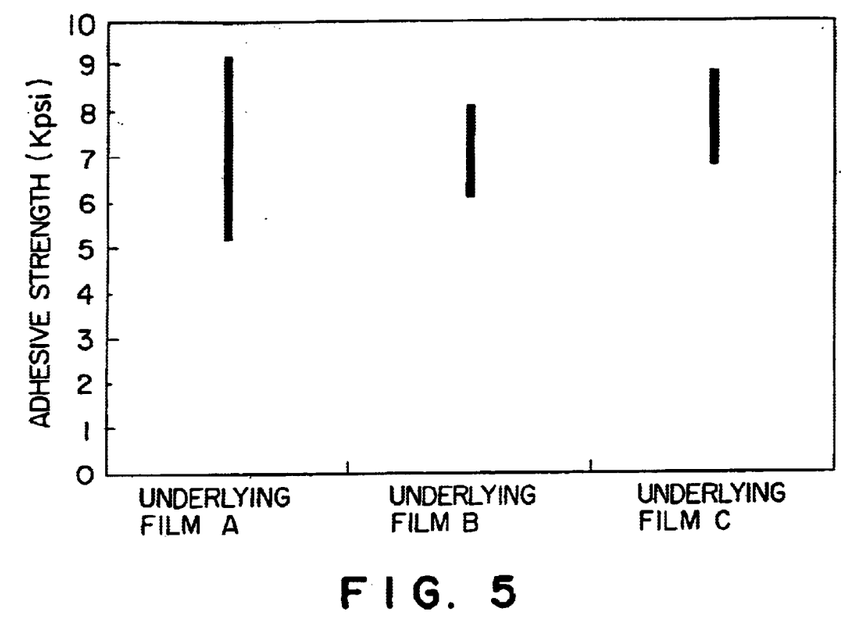
FIG. 5 is a graph showing the difference between the adhesive strengths of underlying film to a hard mask.

The difference between the adhesive strengths of three kinds of underlying films A, B and C to a hard mask of SiCN was examined. The results thereof are shown in the graph of FIG. 5. In this case, the underlying film A is the above described fluorine-containing carbon film, the underlying film B is a "SiCO(H) film, where (H) is H in a $C_xH_y$ group", and the underlying film C in an SOD (Spin On Dielectric) film. The method for measuring the adhesive strength is the same as the above described method. The SiCO(H) film is formed by the plasma CVD method using, e.g., methylsilane which is expressed by $SiH_x(CH_3)_y$, or an alkoxysilane as a raw material, alone or with oxygen-containing gas ($O_2$, $N_2O$, etc.). In this case, the SOD film is made of SiLK which is an organic polymer.

Figure 6:
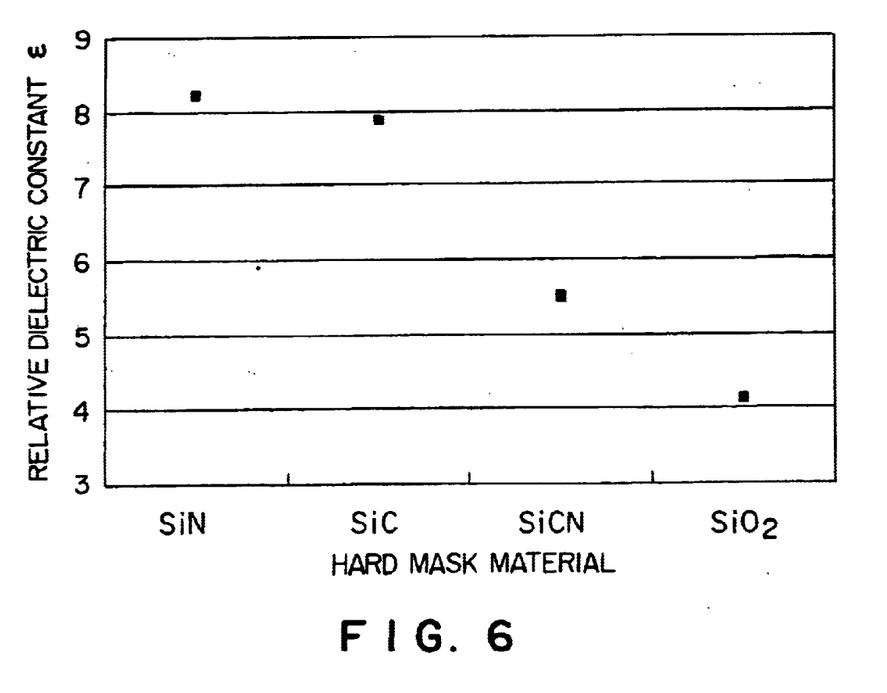
FIG. 6 is a graph showing the difference between the relative dielectric constants of hard mask materials.

As described above, the hard mask is used as a part of an interlayer dielectric file between wiring layers. Therefore, even if the hard mask is thinner than the fluorine-containing carbon film, it is desirable that its dielectric constant is as small as possible. Therefore, comparing the relative dielectric constants $\epsilon$ of various hard mask materials with each other as shown in the graph of FIG. 6, the relative dielectric constant $\epsilon$ of SiCN in this preferred embodiment is about 5.5 which is far lower than about 8 of SiN or SiC although it is higher than about 4 of $SiO_2$.

[Second Preferred Embodiment]

The second preferred embodiment of the present invention will be described. In the second preferred embodiment, boron (B) is added to a hard mask of SiCN in order to further lower the dielectric constant of the hard mask material for the above described reason. Although the relative dielectric constant $\epsilon$ of SiCN itself is about 5.5 as described above, the dielectric constant $\epsilon$ can be lowered to about 5.1 if boron is added to SiCN. Other constructions are the same as those in the above described first preferred embodiment.

In order to add boron, $BF_3$ may be used in addition to $SiH_4$, $C_2H_4$ and $N_2$ as raw material gases in the chemical vapor deposition method during the formation of the insulating film 208 of SiCN shown in, e.g., FIG. 2(b). As a combination of raw material gases, a combination of $SiH_4$, $C_2H_4$ and $BF_3$, or a combination of $SiH_4$, $BF_3$ and $N_2$ may be used. In place of $BF_3$, $B_2F_6$ may be used. Thus, the insulating film is formed of boron-containing SiCN, Sic or SiN (SiBNC, SiBC or SiBN).

The addition of boron may be carried out by the ion implantation into the insulating film already deposited.

Figure 7:
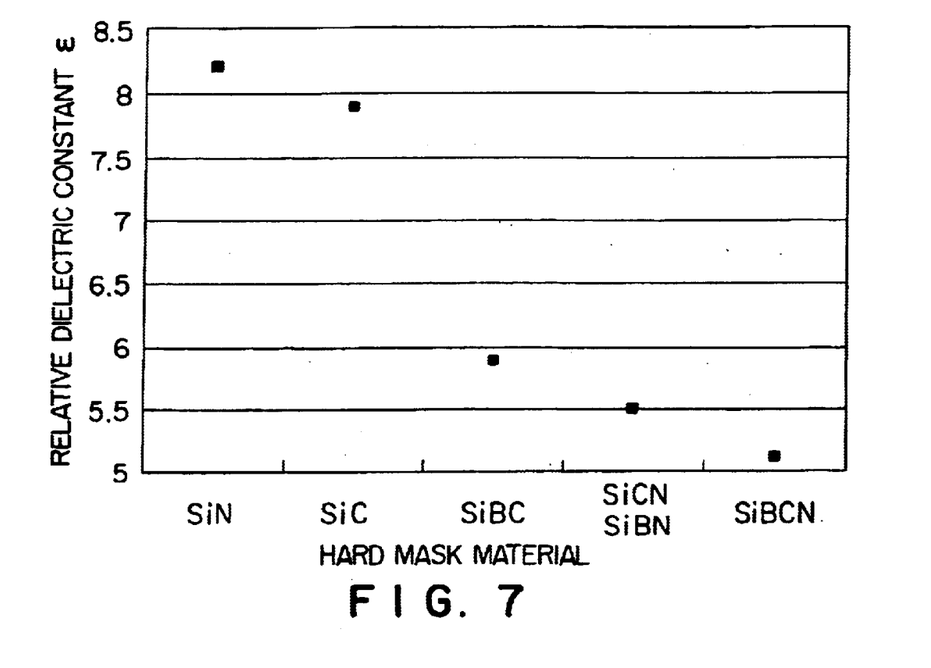
FIG. 7 is a graph showing the difference between the relative dielectric constants of boron-containing hard mask materials.

The variation in relative dielectric constant was examined when boron was added to SiN, SiC and SiCN. The results thereof are shown in the graph of FIG. 7. As shown in FIG. 7, although the relative dielectric constants $\epsilon$ of SiN, SiC and SiCN are about 8.2, 7.9 and 5.5, respectively, the relative dielectric constants $\epsilon$ of SiBN, SiBC and SiBCN, which are formed by adding boron thereto, are lowered to be about 5.9, 5.5 and 5.1, respectively.

[Other Preferred Embodiments]

While the hard mask of SiCN has been formed by the process using "$SiH_4+C_2H_4+N_2$" as raw material gases in the above described preferred embodiments, the hard mask may be formed by a process using other raw material gases.

Figure 8:
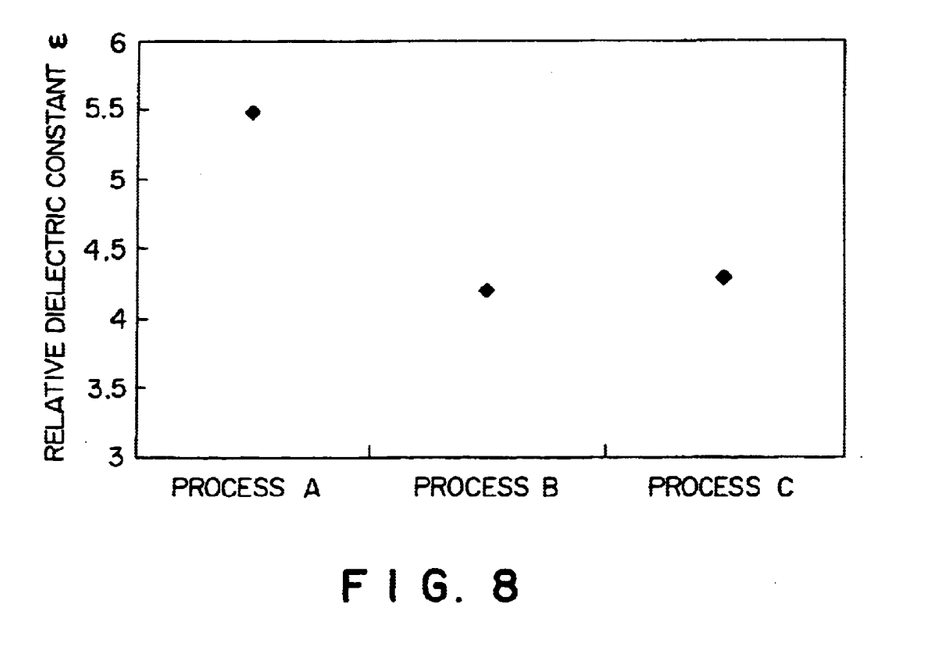
FIG. 8 is a graph showing the difference in relative dielectric constant of a hard flask in processes.

Hard masks of SiCN were formed by different three kinds of processes (raw materials) A, B and C, and the difference between relative dielectric constants of the hard masks of SiCN was examined. The results thereof are shown in the graph of FIG. 8. In this case, the process A uses "$SiH_4$+(a carbon-containing raw material gas)+(a nitrogen-containing raw material gas)" as raw material gases, similar to the above described process. In the processes B and C, SiH$_4$ in the process A is replaced with SiH$_x$(CH$_3$)$_y$ and an alkoxysilane, respectively, to be used as raw material gases.

The carbon-containing raw material gas may be CH$_4$, C$_2$H$_6$, C$_3$H$_8$ or C$_2$H$_2$ other than the above described C$_2$H$_4$. The nitrogen-containing raw material gas may be NF$_3$, N$_2$O, NO$_2$, N$_2$O$_4$, NO or NH$_4$ other than the above described N$_2$.

As shown in FIG. 8, although the relative dielectric constant $\epsilon$ is about 5.5 in the process A which is used in the above described preferred embodiment, the relative dielectric constants $\epsilon$ in the processes B and C are lowered to be about 4.2 to 4.3. That is, according to the above described processes B and C, the relative dielectric constant can be further lowered as compared with that in the above described second preferred embodiment that boron is added.

While the plasma of oxygen gas has been used for etching the fluorine-containing carbon film, the plasma of a mixed gas of hydrogen gas, argon gas and nitrogen gas may be used. In this case, the flow ratio of argon gas to the mixed gas (Ar/(N$_2$+H$_2$+Ar)) may be substantially about 0.7 to about 0.8. The flow ratio of hydrogen gas to nitrogen gas (H$_2$/(N$_2$+H$_2$)) may be substantially 0.2 to 0.9. The degree of vacuum in plasma producing atmosphere may be about 5 mTorr to about 15 mTorr.

Also in this case, when the hard mask material is processed simultaneously with the fluorine-containing carbon film similar to when oxygen gas is used, the etch rate (nm/min.) of the hard mask material of SiCN is far smaller than those of other hard mask materials.

| Fluorine-containing carbon film | 1826 |
|---|---|
| SiN | 58 |
| SiC | 88 |
| SiO$_2$ | 95 |
| SiCN | 18 |

The feature of the above described use of hydrogen gas for etching will be described. When the reactive ion etching with the plasma of hydrogen gas, argon gas and nitrogen gas is used for etching the fluorine-containing carbon film, the anisotropy of etching can be higher than that when oxygen gas is used.

It is considered that reactive ions and radicals are produced as etching active-species by producing plasma in dry etching processes. In a reactive ion etching, an electric field is utilized for mainly flying reactant ions to an object to be etched, the process is carried out in a high vertical anisotropic state.

However, since plasma is produced in atmosphere, radicals, which have not been attracted by the electric field, finally reach the object to be etched, to participate in the etching reaction. If the etching reaction due to the radicals occurs, a side etching, by which regions underlying the aster pattern are etched, occurs. In such a mechanism, in the reactive ion etching with the plasma of oxygen gas, oxygen radicals have a high reactivity with respect to organic compounds, so that the oxygen radicals excessively participate in the etching reaction to lower the controllability of the etched shape of the fluorine-containing carbon film.

On the other hand, when the above described mixed gas of hydrogen gas, argon gas and nitrogen gas is used, the etching active-species against the fluorine-containing carbon film mainly become reactive hydrogen ions and radicals. However, hydrogen radicals do not have so high reactivity with respect to organic compounds. For that reason, in the case of the reactive ion etching using the mixed gas, the etching active-species against the fluorine-containing carbon film are substantially only reactive hydrogen ions. That is, in this case, the etching hardly proceeds by radicals having no directionality.

As a result, when the mixed gas of hydrogen gas, argon gas and nitrogen gas is used, a higher anisotropy is obtained to inhibit the side etching and so forth, so that it is possible to improve processing precision, such as directional controllability.

While the groove has been formed in the interlayer film of the fluorine-containing carton film to be filled with the wiring layer in the above described preferred embodiments, the present invention should not be limited thereto. For example, a structure shown in FIG. 9 may be provided. In this structure, a hard mask 702 of SiCN is formed on an interlayer dielectric film 701 of a fluorine-containing carbon film, and a wiring layer 703 is formed thereon. The wiring layer 703 is connected to an underlying wiring layer (not shown) via a through-hole which is formed in the interlayer dielectric layer 701 and hard mask 702.

Figure 9:
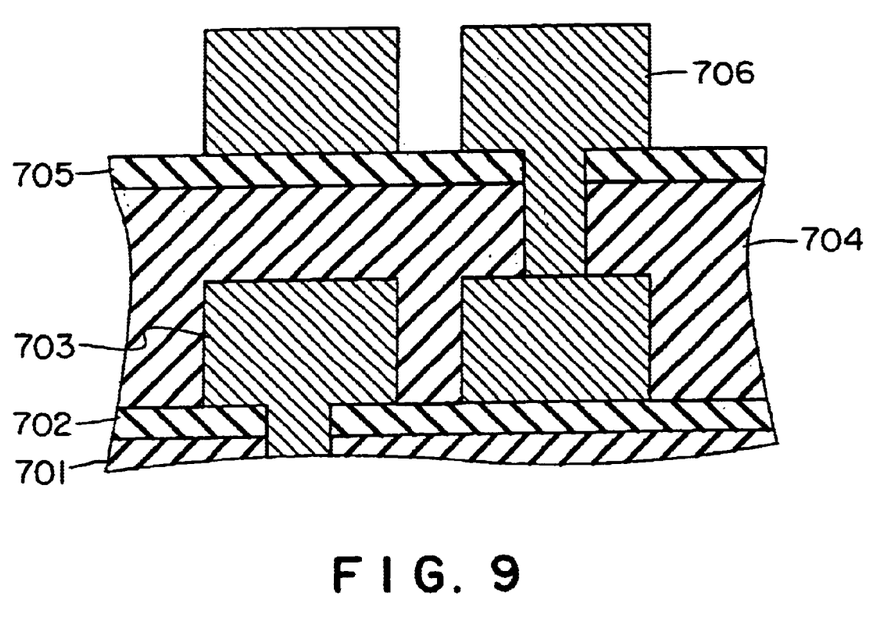
FIG. 9 is a local longitudinal section showing the structure of another preferred embodiment of a semiconductor device according to the present invention.

On the hard mask 702, an interlayer dielectric film 704 of a fluorine-containing carbon film is formed so as to cover the wiring layer 703. A hard mask 705 of SiCN is formed on the interlayer dielectric film 704, and a wiring layer 706 is formed thereon. The wiring layer 706 is connected to an underlying wiring layer 703 via a through-hole which is formed in the interlayer dielectric film 704 and hard mask 705.

In this case, the hard masks 702 and 705 are used for forming the through-holes for connecting the wiring layers to each other. Therefore, in this case, one fine patterning process is carried out for, e.g., the hard mask 705 and the interlayer dielectric film 704. However, for example, the wiring layer 706 is formed by forming a metal film on the hard mask 705 and by fine-patterning the metal film by well-known photolithography and etching techniques.

While the wiring layer hits been made of Cu in the above described preferred embodiments, the present invention should not be limited thereto, but the wiring layer may be made of any one of other conductive materials, such as aluminum (Al).

What is claimed is:

1. A method of manufacturing a semiconductor device comprising the steps of:

forming a wiring layer on a semiconductor substrate having an active region formed thereon;

forming a first insulating layer containing carbon on said wiring layer;

forming a second insulating layer comprising silicon, carbon and nitrogen on said first insulating layer;

selectively etching said second insulating layer to form a first hole portion therethrough;

selectively etching said first insulating layer with plasma to form a second hole portion therethrough, using said selectively-etched second insulating layer as a first mask pattern;

further selectively etching said second insulating layer to form a first groove portion therethrough;

further selectively etching said first insulating layer with plasma to form a second groove portion therethrough, using said further selectively-etched second insulating layer as a second mask pattern; and forming a new wiring layer on said second insulating layer after further selectively etching said first insulating layer, said hole portions and groove portions being filled with a material of said new wiring layer.

2. The method of claim 1, wherein said step of selectively etching said second insulating layer is carried out with the plasma of the gas of a compound containing carbon and fluorine.

3. The method of claim 1, wherein said step of selectively etching said second insulating layer is carried out with the plasma of the gas of a compound containing carbon and hydrogen.

4. The method of claim 1, wherein said step of selectively etching said first insulating layer is carried out with the plasma of an oxygen-containing gas.

5. The method of claim 1, wherein said step of selectively etching said first insulating layer is carried out with the plasma of a hydrogen-containing gas.

6. The method of claim 1, wherein said step of further selectively etching said second insulating layer is carried out with the plasma of the gas of a compound containing carbon and fluorine.

7. The method of claim 1, wherein said step of further selectively etching said second insulating layer is carried out with the plasma of the gas of a compound containing carbon and hydrogen.

8. The method of claim 1, wherein said step of further selectively etching said first insulating layer is carried out with the plasma of an oxygen-containing gas.

9. The method of claim 1, wherein said step of further selectively etching said first insulating layer is carried out with the plasma of a hydrogen-containing gas.

10. The method of claim 1, further comprising adding boron to said second insulating layer.

11. The method of claim 1, wherein said hole portions and said groove portions at least partially overlap.

12. A method of manufacturing a semiconductor device comprising:

forming a wiring layer on a semiconductor substrate having an active region formed thereon;

forming a first insulating layer containing carbon on said wiring layer;

forming a second insulating layer comprising silicon, carbon and nitrogen on said first insulating layer;

selectively etching said second insulating layer until the surface of said first insulating layer is partially exposed;

selectively etching said first insulating layer with plasma, using said selectively-etched second insulating layer as a first mask pattern, until the wiring layer is partially exposed, further selectively etching said second insulating layer to expose more of the surface of said first insulating layer;

further selectively etch said first insulating layer with plasma, using said selectively-etched second insulating layer as a second mask pattern, without substantially exposing more wiring layer, and forming a new wiring layer on said second insulating layer after further selectively etching said first insulating layer.

13. The method of claim 12, wherein at least one of said step of selectively etching said second insulating layer or said step of further selectively etching said second insulating layer is carried out with the plasma of the gas of a compound containing carbon and fluorine.

14. The method of claim 12, wherein at least one of said step of selectively etching said second insulating layer or said step of further selectively etching said second insulating layer is carried out with the plasma of the gas of a compound containing carbon and hydrogen.

15. The method of claim 12, wherein at least one of said step of selectively etching said first insulating layer or said step of further selectively etching said first insulating layer is carried out with the plasma of an oxygen-containing gas.

16. The method of claim 12, wherein at least one of said step of selectively etching said first insulating layer or said step of further selectively etching said first insulating layer is carried out with the plasma of a hydrogen-containing gas.

17. The method of claim 12, further comprising adding boron to said second insulating layer.

* * * * *